United States Patent
Lu et al.

(10) Patent No.: US 12,100,741 B2
(45) Date of Patent: Sep. 24, 2024

(54) LATERAL DOUBLE-DIFFUSED TRANSISTOR AND MANUFACTURING METHOD THEREOF

(71) Applicant: Joulwatt Technology (Hangzhou) Co., Ltd., Hangzhou (CN)

(72) Inventors: Yang Lu, Hangzhou (CN); Guangtao Han, Hangzhou (CN); Weiwei Ge, Hangzhou (CN)

(73) Assignee: JOULWATT TECHNOLOGY (HANGZHOU) CO., LTD., Hangzhou (CN)

( * ) Notice: Subject to any disclaimer, the term of this patent is extended or adjusted under 35 U.S.C. 154(b) by 536 days.

(21) Appl. No.: 17/086,255

(22) Filed: Oct. 30, 2020

(65) Prior Publication Data

US 2021/0175336 A1    Jun. 10, 2021

(30) Foreign Application Priority Data

Dec. 10, 2019   (CN) .......................... 201911259455.4

(51) Int. Cl.
*H01L 29/40*    (2006.01)
*H01L 29/66*    (2006.01)
(Continued)

(52) U.S. Cl.
CPC .......... *H01L 29/404* (2013.01); *H01L 29/401* (2013.01); *H01L 29/665* (2013.01); *H01L 29/66681* (2013.01); *H01L 29/7816* (2013.01)

(58) Field of Classification Search
CPC ............ H01L 29/7835; H01L 29/0847; H01L 29/1095; H01L 29/36; H01L 29/404;
(Continued)

(56) References Cited

U.S. PATENT DOCUMENTS 5,387,535 A * 2/1995 Wilmsmeyer .... H01L 21/76895
                                                                    438/586
5,552,625 A * 9/1996 Murakami ............... H01L 29/36
                                                                    257/630

(Continued)

FOREIGN PATENT DOCUMENTS

CN       104465404 A      3/2015
CN       110364567 A     10/2019
(Continued)

*Primary Examiner* — Maliheh Malek
(74) *Attorney, Agent, or Firm* — Treasure IP Group, LLC

(57) ABSTRACT

The present disclosure relates to a lateral double-diffused transistor and a manufacturing method of the transistor. The transistor comprises: a substrate; a well region and a drift region both located in the top of the substrate, a source region located in the well region, and a drain region located in the drift region; a first dielectric layer located on a surface of the drift region; a first field plate layer located above the drift region and covering a first portion of the first dielectric layer; a second dielectric layer covering a surface of part of the first field plate layer and stacked on a surface of a second portion of the first dielectric layer; a second field plate layer located on a surface of the second dielectric layer, comprising at least one contact channel. According to the present disclosure, the transistor increases breakdown voltage and reduces on-state resistance.

19 Claims, 8 Drawing Sheets

(51) Int. Cl.
*H01L 29/78* (2006.01)
*H01L 29/06* (2006.01)

(58) Field of Classification Search
CPC ............ H01L 29/7816; H01L 29/7394; H01L 27/1203; H01L 29/063; H01L 29/0649; H01L 29/0834; H01L 29/1083; H01L 29/8611; H01L 29/0653; H01L 29/66681; H01L 29/665; H01L 29/42368; H01L 29/4933; H01L 29/1045; H01L 29/66659; H01L 29/401; H01L 29/66689
See application file for complete search history.

(56) References Cited

U.S. PATENT DOCUMENTS

| | | | | |
|---|---|---|---|---|
| 5,864,167 | A * | 1/1999 | Cutter | H01L 29/0638 |
| | | | | 257/490 |
| 6,023,090 | A * | 2/2000 | Letavic | H01L 29/0878 |
| | | | | 257/E29.279 |
| 6,346,451 | B1 * | 2/2002 | Simpson | H01L 29/42368 |
| | | | | 257/E29.279 |
| 6,468,878 | B1 * | 10/2002 | Petruzzello | H01L 29/7394 |
| | | | | 257/E29.12 |
| 6,559,011 | B1 * | 5/2003 | Shibib | H01L 29/7835 |
| | | | | 257/329 |
| 6,794,719 | B2 * | 9/2004 | Petruzzello | H01L 29/7824 |
| | | | | 257/350 |
| 6,831,338 | B1 * | 12/2004 | Roy | H01L 29/402 |
| | | | | 257/500 |
| 7,868,378 | B1 * | 1/2011 | Zuniga | H01L 29/7816 |
| | | | | 438/236 |
| 7,964,915 | B2 * | 6/2011 | Tanaka | H01L 29/66659 |
| | | | | 257/341 |
| 8,476,698 | B2 * | 7/2013 | Guan | H01L 29/7823 |
| | | | | 257/E29.256 |
| 8,957,502 | B2 * | 2/2015 | Cao | H01L 29/0634 |
| | | | | 257/341 |
| 8,975,720 | B2 * | 3/2015 | Guan | H01L 29/0696 |
| | | | | 257/342 |
| 9,741,788 | B2 * | 8/2017 | Takahashi | H01L 29/7811 |
| 10,217,828 | B1 * | 2/2019 | Ding | H01L 29/402 |
| 10,388,722 | B2 * | 8/2019 | Falck | H01L 29/7802 |
| 10,636,904 | B2 * | 4/2020 | Chou | H01L 29/66689 |
| 10,756,208 | B2 * | 8/2020 | Lu | H01L 29/78 |
| 10,818,788 | B2 * | 10/2020 | Su | H01L 29/0634 |
| 10,957,764 | B2 * | 3/2021 | Niedernostheide | |
| | | | | H01L 29/0615 |
| 11,462,628 | B2 * | 10/2022 | Jin | H01L 29/404 |
| 11,652,098 | B2 * | 5/2023 | Wang | H01L 27/0262 |
| | | | | 257/173 |
| 2004/0201061 | A1 * | 10/2004 | Jeon | H01L 29/0634 |
| | | | | 257/E29.066 |
| 2006/0175658 | A1 * | 8/2006 | Lee | H01L 29/7835 |
| | | | | 257/E29.054 |
| 2007/0200195 | A1 * | 8/2007 | Tanaka | H01L 29/0878 |
| | | | | 257/E29.268 |
| 2008/0023785 | A1 * | 1/2008 | Hebert | H01L 21/26513 |
| | | | | 257/E21.336 |
| 2011/0204442 | A1 * | 8/2011 | Guan | H01L 29/0634 |
| | | | | 257/E29.256 |
| 2012/0126315 | A1 * | 5/2012 | Onishi | H01L 29/0634 |
| | | | | 257/329 |
| 2013/0134512 | A1 * | 5/2013 | Cheng | H01L 29/402 |
| | | | | 257/E29.256 |
| 2013/0181328 | A1 * | 7/2013 | Cao | H01L 29/7395 |
| | | | | 257/618 |
| 2013/0187226 | A1 * | 7/2013 | Park | H01L 29/0882 |
| | | | | 257/E29.255 |
| 2014/0131796 | A1 * | 5/2014 | Zhou | H01L 29/1083 |
| | | | | 438/286 |
| 2016/0268423 | A1 * | 9/2016 | Koepp | H01L 29/4236 |
| 2017/0186856 | A1 * | 6/2017 | Han | H01L 21/26586 |
| 2017/0194488 | A1 * | 7/2017 | Gao | H01L 29/0692 |
| 2019/0096988 | A1 * | 3/2019 | Murukesan | H01L 27/088 |
| 2019/0259751 | A1 * | 8/2019 | Pala | H01L 29/402 |
| 2020/0083370 | A1 * | 3/2020 | Renaud | H01L 29/402 |
| 2020/0126990 | A1 * | 4/2020 | Zhang | H01L 29/404 |
| 2020/0176599 | A1 * | 6/2020 | Mehrotra | H01L 29/7831 |
| 2020/0373395 | A1 * | 11/2020 | Ho | H01L 29/7816 |
| 2020/0395452 | A1 * | 12/2020 | Wang | H01L 29/7835 |
| 2021/0104630 | A1 * | 4/2021 | Chung | H01L 29/7835 |
| 2021/0111254 | A1 * | 4/2021 | Jones | H01L 29/7786 |
| 2021/0119041 | A1 * | 4/2021 | Ma | H01L 29/0649 |
| 2021/0159319 | A1 * | 5/2021 | Mehrotra | H01L 29/66704 |
| 2021/0167190 | A1 * | 6/2021 | Jin | H01L 29/66659 |
| 2021/0210480 | A1 * | 7/2021 | Wang | H01L 27/0262 |
| 2021/0399087 | A1 * | 12/2021 | Murukesan | H01L 21/823493 |
| 2022/0020863 | A1 * | 1/2022 | Han | H01L 29/66681 |
| 2022/0052197 | A1 * | 2/2022 | Wada | H01L 29/063 |
| 2022/0123142 | A1 * | 4/2022 | Yanagi | H01L 29/0692 |
| 2022/0140140 | A1 * | 5/2022 | Li | H01L 29/402 |
| | | | | 257/288 |
| 2022/0262948 | A1 * | 8/2022 | Jin | H01L 29/404 |
| 2022/0293771 | A1 * | 9/2022 | Lin | H01L 29/7816 |
| 2022/0302158 | A1 * | 9/2022 | Maeda | H10B 43/27 |
| 2022/0384639 | A1 * | 12/2022 | Li | H01L 29/66689 |
| 2023/0163177 | A1 * | 5/2023 | Jin | H01L 29/66659 |
| | | | | 257/339 |
| 2023/0231020 | A1 * | 7/2023 | Chuang | H01L 29/0649 |

FOREIGN PATENT DOCUMENTS

| | | |
|---|---|---|
| CN | 111368490 A | 7/2020 |
| CN | 111710719 A | 9/2020 |
| CN | 111710720 A | 9/2020 |

* cited by examiner

LATERAL DOUBLE-DIFFUSED TRANSISTOR AND MANUFACTURING METHOD THEREOF

CROSS-REFERENCE TO RELATED APPLICATIONS

The present application claims the priority of Chinese Patent Application No. 201911259455.4, filed on Dec. 10, 2019 and entitled by "LATERAL DOUBLE-DIFFUSED TRANSISTOR AND MANUFACTURING METHOD THEREOF", which is incorporated herein by reference in its entirety.

FIELD OF TECHNOLOGY

The present disclosure relates to a technical field of semiconductor, in particular to a lateral double-diffused transistor and a manufacturing method of the lateral double-diffused transistor.

BACKGROUND

Power field effect transistors are an important type of transistors. The power field effect transistors mainly include vertical diffused metal oxide semiconductor (VDMOS) transistors and lateral double-diffused metal oxide semiconductor (LDMOS) transistors. Compared with the VDMOS transistors, the LDMOS transistors have many advantages, such as better compatibility with planar complementary metal oxide semiconductor (CMOS) process, better thermal stability and frequency stability, higher gain, lower feedback capacitance and thermal resistance, and constant input impedance, so that the LDMOS transistors are widely used in many applications.

In applications of a LDMOS transistor, it is required to reduce an on-state resistance between a source and a drain of the transistor as much as possible on a premise that a breakdown voltage BV_dss between the source and the drain of the transistor is high enough. However, optimization requirements on the breakdown voltage and the on-state resistance between the source and the drain of the transistor are contradictory. Therefore, in order to make the off-state breakdown voltage (off_BV) relatively high and the on-state resistance (Rdson) relatively low, it is necessary to make a compromise between a doping concentration of a drift region of the transistor and a thickness of an oxide layer located above the drift region, in order to make the voltage off_BV and the resistance Rdson relatively suitable.

In a VDMOS device in the prior art, a single field plate layer is formed on the surface of a dielectric layer. The distance between the field plate layer and the semiconductor surface is constant, and the thickness of the oxide dielectric layer is uniform, which can not meet the requirements on high off-state breakdown voltage (off_BV) and low on-state resistance (Rdson) simultaneously, resulting in a poor performance of the transistor.

SUMMARY

In view of the existing status, the present disclosure provides a lateral double-diffused transistor and a manufacturing method of the lateral double-diffused transistor. A salicidation block layer formed by a standard CMOS process is used as a second dielectric layer and at least one contact channel is used as a second field plate layer, so that a stair-shaped field dielectric layer with increasing thickness is formed and a distance between the second field plate layer and a silicon substrate is increased, effectively increasing the breakdown voltage of the transistor and reducing the on-state resistance.

According to one aspect of the present disclosure, provided is a lateral double-diffused transistor, wherein the transistor comprises: a substrate; a well region and a drift region both located in top of the substrate, a source region located in the well region, and a drain region located in the drift region; a first dielectric layer located on a surface of the drift region; a first field plate layer located above the surface of the drift region and covering a first portion of the first dielectric layer; a second dielectric layer partially covering a surface of the first field plate layer and stacked on a surface of a second portion of the first dielectric layer; a second field plate layer located on a surface of the second dielectric layer, wherein the second field plate layer comprising at least one contact channel.

In an alternative embodiment, wherein the second dielectric layer is a salicidation block layer for preventing metal silicide from forming in a region covered by the salicidation block layer.

In an alternative embodiment, wherein the salicidation block layer is an oxide layer.

In an alternative embodiment, wherein each contact channel included in the at least one contact channel is a metal plug filled in a corresponding one of at least one through hole which is formed in the second field plate layer and extends perpendicularly to the surface of the second dielectric layer.

In an alternative embodiment, wherein the second field plate layer comprises a plurality of contact channels, each of which is included in said at least one contact channel, arranged in a row along an extension direction from the source region to the drain region.

In an alternative embodiment, wherein one of the plurality of contact channels which is located above the first field plate layer has a height less than a height of another one of the plurality of contact channels which is located above the second portion of the first dielectric layer.

In an alternative embodiment, wherein the plurality of contact channels are respectively connected to different potentials.

In an alternative embodiment, wherein the transistor further comprises a side wall, which is located in a contact region between a side surface of the first field plate layer and the second dielectric layer, and used as an isolation layer.

In an alternative embodiment, wherein the first dielectric layer extends along a direction from the source region to the drain region and covers a part of the drain region.

According to another aspect of the present disclosure, provided is a method for manufacturing a lateral double-diffused transistor, the method comprises: forming a well region and a drift region in top of a substrate; forming a source region located in the well region, and a drain region located in the drift region; forming a first dielectric layer located on a surface of the drift region; forming a first field plate layer located above the surface of the drift region and covering a surface of a first portion of the first dielectric layer; forming a second dielectric layer partially covering a surface of the first field plate layer and stacked on a surface of a second portion of the first dielectric layer; forming a second field plate layer located on a surface of the second dielectric layer, wherein the second field plate layer comprising at least one contact channel.

In an alternative embodiment, wherein the second dielectric layer is a salicidation block layer for preventing metal silicide from forming in a region covered by the salicidation block layer.

In an alternative embodiment, wherein the salicidation block layer is an oxide layer.

In an alternative embodiment, wherein each contact channel included in the at least one contact channel is a metal plug filled in a corresponding one of at least one through hole which is formed in the second field plate layer and extends perpendicularly to the surface of the second dielectric layer.

In an alternative embodiment, wherein the second field plate layer comprises a plurality of contact channels, each of which is included in said at least one contact channel, arranged in a row along an extension direction from the source region to the drain region.

In an alternative embodiment, wherein one of the plurality of contact channels which is located above the first field plate layer has a height less than a height of another one of the plurality of contact channels which is located above the second portion of the first dielectric layer.

In an alternative embodiment, wherein the plurality of contact channels are respectively connected to different potentials.

In an alternative embodiment, wherein the method further comprises: forming a side wall located in a contact region between a side surface of the first field plate layer and the second dielectric layer.

In an alternative embodiment, wherein the step of forming the second dielectric layer comprises: depositing the salicidation block layer on the substrate, the first field plate layer, and the first dielectric layer; covering a surface of the salicidation block layer located above the drift region with a resist mask; and etching and removing a portion of the salicidation block layer which is uncovered by the resist mask.

In an alternative embodiment, wherein the step of forming the second field plate layer comprises: successively depositing an oxide layer, an etching barrier layer and an interlayer dielectric layer on the surface of the second dielectric layer; etching the interlayer dielectric layer, the etching barrier layer and the oxide layer to form the at least one through hole; depositing metal in each one of the at least one through hole to form the metal plug; and performing planarization.

In an alternative embodiment, wherein material of the first field plate layer comprises polysilicon, and material of the first dielectric layer comprises oxide.

In an alternative embodiment, wherein a thickness of the first dielectric layer is 300-800 angstroms, and a thickness of the second dielectric layer is 500-1000 angstroms.

In the lateral double-diffused transistor and the manufacturing method of the lateral double-diffused transistor according to embodiments of the present disclosure, the plurality of contact channels are used as the second field plate layer, which avoids an etching process on polysilicon during forming the second field plate layer, thus saving resources and area occupied by the transistor, and making the distance between the second field plate layer and the surface of the substrate large enough, improving the breakdown voltage and reducing the on-state resistance between the source and the drain.

In an alternative embodiment, the second field plate layer comprises the plurality of contact channels arranged in a row, which are respectively connected to different potentials to increase electrical connection between the transistor and other components. The plurality of contact channels which are arranged discontinuously can also change a distribution of electric field, thus increasing the breakdown voltage.

According to an alternative embodiment, the salicidation block layer, which is commonly used in transistor manufacturing processes, is used as the second dielectric layer, so that the salicidation block layer can not only be stacked on the surface of the first dielectric layer to make the dielectric layer located above the drain region thick enough, but also protect silicon regions located below the salicidation block layer. Compared with the traditional lateral double-diffused transistor manufacturing method which requires additional processes for manufacturing the second dielectric layer and the second field plate layer, the embodiments according to the present disclosure uses the salicidation block layer as a dielectric layer, thus there is no need to etch an oxide layer to form the second dielectric layer, which reduces steps of manufacturing process. Meanwhile, the salicidation block layer is stacked on the surface of the first dielectric layer to make the dielectric layer located above the drain region thick enough, which forms a stair-shaped dielectric layer structure from the source region to the drain region, effectively increasing the breakdown voltage of the transistor and reducing the on-state resistance between the source and the drain.

BRIEF DESCRIPTION OF THE DRAWINGS

The above and other purposes, features and advantages of the present invention will become more apparent from the description below with reference to the accompanying drawings. Wherein.

DESCRIPTION OF THE EMBODIMENTS

Figure 1:
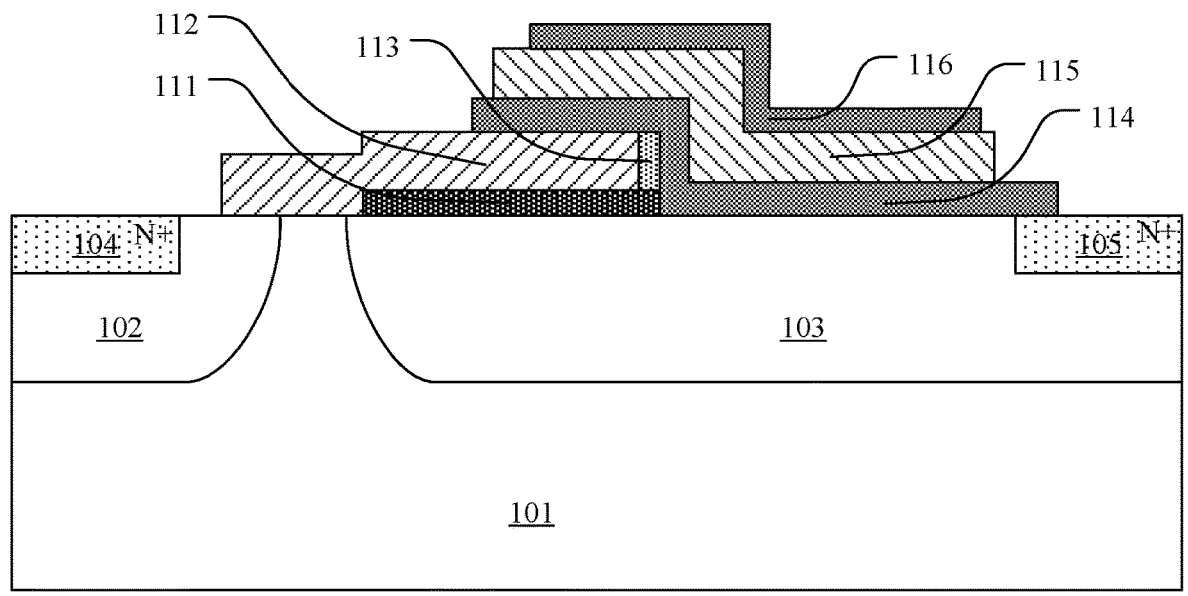
FIG. 1 shows a cross-sectional structural schematic view of a lateral double-diffused transistor according to an embodiment of the correlation techniques.

Various embodiments of the present invention will be described in more detail below with reference to the accompanying drawings. In the various figures, the same elements are denoted by the same or similar reference numerals. For the sake of clarity, the various parts in the figures are not drawn to scale. In addition, some public information may not be disclosed. For the sake of brevity, the semiconductor structure obtained after several steps can be described in one accompanying drawing.

When describing the structure of a device, if a layer or a region is referred to as "on" or "above" another layer or another region, it can mean that the layer or the region is located directly on the another layer or the another region, or there are other layers or other regions between the layer or the region and the another layer or the another region. Moreover, if the device is flipped, the layer or the region will be "beneath" or "below" the another layer or the another region.

In order to describe the situation in which the layer or the region is directly located on the another layer or the another region, the present disclosure will adopt the expression of "A is directly located on B" or "A is on and adjacent to B". In the present disclosure, "A is directly located in B" means that A is located in B and A is directly adjacent to B, rather than A is located in the doping region formed in B.

In order to better understand technical solutions of the present disclosure, many specific details, such as structure, materials, dimensions, treatment processes and techniques of semiconductor devices, are described below. However, a person skilled in the art should understand that the present disclosure can still be implemented without certain specific details.

Unless specifically noted below, the layers or the regions of the semiconductor devices may be composed of material well known to those skilled in the art. Semiconductor materials include III-V semiconductors, such as GaAs, InP, Gan, and SiC, and IV semiconductors, such as Si, and Ge. Gate conductor and electrode layer may be formed form various conductive materials, such as metal layer, doped polysilicon layer, stacked gate conductor including the metal layer, the doped polysilicon layer, and other conductive materials, such as TaC, TiN, TaSiN, HfSiN, TiSiN, TiCN, TaAlC, TiAlN, TaN, PtSix, $Ni_3Si$, Pt, Ru, W, and a combination of the various conductive materials. Gate dielectric may consist of $SiO_2$ or materials with a dielectric constant greater than $SiO_2$, such as oxides, nitrides, oxynitrides, silicates, aluminates, and titanates. Moreover, the gate dielectric can be formed not only from materials known to the skilled in the art, but also materials developed in the future for the gate dielectric.

In the present disclosure, the term "semiconductor structure" refers to the entire semiconductor structure formed during each step of the fabrication procedure of a semiconductor device, including all layers or regions that have been formed. The term "lateral extension" refers to the extension along a direction roughly perpendicular to the depth of the trench.

The specific embodiments of the present disclosure are further described in detail referring to the accompanying drawings and the embodiments below.

FIG. 1 shows a cross-sectional structural schematic view of a lateral double-diffused transistor according to an embodiment of the correlation techniques.

As shown in FIG. 1, the lateral double-diffused transistor of the correlation techniques comprises: an N-type doped semiconductor substrate 101, such as a silicon substrate; a P-type well region 102 located in top of the semiconductor substrate 101; an N-type drift region 103 located laterally beside the P-type well region 102 in the semiconductor substrate 101; a source region 104 located in the P-type well region 102; and a drain region 105 located in the N-type drift region 103. The source region 104 and the drain region 105 are both N-type doped regions.

The lateral double-diffused transistor further comprises: a first dielectric layer 111 located on the surface of the drift region 103; and a first field plate layer 112 located above the drift region 103 and covering on the surface of the first dielectric layer 111. The lateral double-diffused transistor further comprises: a gate oxide layer, which is not shown in FIG. 1 and is arranged between the first field plate layer 112 and the semiconductor substrate 101. The first field plate layer 112 extends to a partial surface of the N-type drift region 103 and a partial surface of the first dielectric layer 111, which effectively reduces a peak intensity of surface electric field formed by the drift region 103 located below the first field plate layer 112 and improves the breakdown voltage. A depletion layer is formed in the drift region 103 located below the first field plate layer 112 and the first dielectric layer 111, which improves voltage drop condition.

In order to further increase the breakdown voltage and reduce the on-state resistance between the source region and the drain region, the lateral double-diffused transistor further comprises: a second dielectric layer 114 and a second field plate layer 115 located on the surface of the second dielectric layer 114, which are located on the side of the first dielectric layer 111 away from the first field plate layer 112. The second dielectric layer 114 covers a partial surface of the drift region 103 and a partial surface of the first field plate layer 112 and contacts with a side surface of the first dielectric layer 111. The second field plate layer 115 located on a surface of the second dielectric layer 114. The first field plate layer 112 and the second field plate layer 115 are comprised in the gate structure of the lateral double-diffused transistor.

In an alternative embodiment, the lateral double-diffused transistor further comprises: a side wall 113 which is arranged between a side surface of the first field plate layer 112 and the second dielectric layer 114, and used as an isolation layer.

In an alternative embodiment, materials of the source region 104 and the drain region 105 are usually metallic silicide. To avoid reaction of other silicon regions with metal to form metal silicide, a protective oxide layer formed by self-aligned silicon metallization process is used to protect transistor structure. As shown in FIG. 1, for example, a protective oxide layer 116 is covered on the surface of the second field plate layer 115 to form a protection layer of silicon regions located below the protective oxide layer 116. Then, a source electrode, a drain electrode, one or more contact holes, one or more contact channels or one or more wiring terminals will be fabricated in subsequent processes.

The thickness of the second dielectric layer 114 located near the drain region 105 is greater than the thickness of the first dielectric layer 111 located near the drain region 105, which in a manner reduces the on-state resistance and improves the breakdown voltage. However, the manufacturing process of the lateral double-diffused transistor device comprises two deposition steps and two photoetching steps to form two dielectric layers and two field plate layers, as well as manufacturing steps to form the salicidation block layer, the one or more contact holes, and the one or more contact channels, thus increasing process cost, production time, production complexity, and difficulties on mass production. In order to further improve transistor performance, reduce the on-state voltage drop and improve the breakdown voltage, an optimized lateral double-diffused metal oxide semiconductor device shown in FIG. 2 is provided, by making improvement on the structure of traditional SGT (Silicon Gate Transistor) devices.

Figure 2:
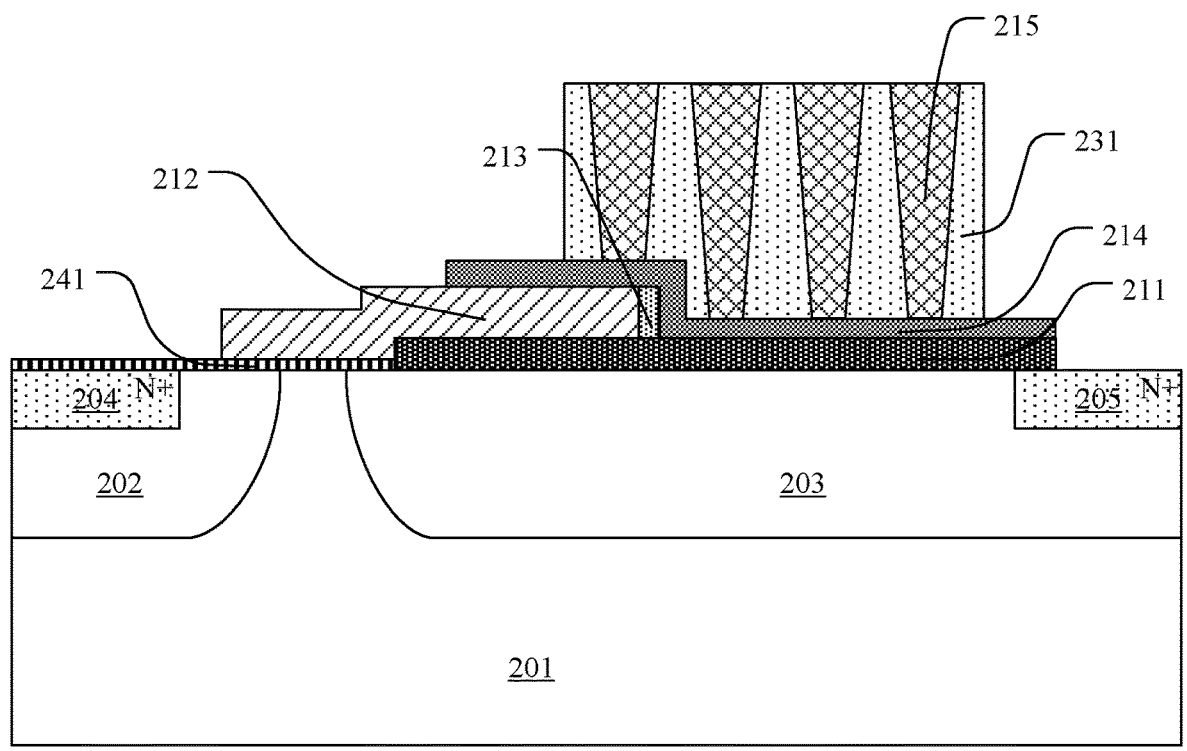
FIG. 2 shows a cross-sectional structural schematic view of a lateral double-diffused transistor according to an embodiment of the present disclosure.

FIG. 2 shows a cross-sectional structural schematic view of a lateral double-diffused transistor according to an embodiment of the present disclosure.

As shown in FIG. 2, the lateral double-diffused transistor comprises: a substrate 201; a P-type well region 202 formed in top of the substrate 201; an N-type drift region 203 located laterally beside the P-type well region 202 in the substrate 201; a source region 204 located in the P-type well region 202; and a drain region 205 located in the N-type drift region 203. The source region 204 and the drain region 205 are both N-type doped regions.

The lateral double-diffused transistor further comprises: a first dielectric layer 211 located on a surface of the drift region 203; and a first field plate layer 212 located above the drift region 203 and covering a surface of a first portion of the first dielectric layer 211. The lateral double-diffused transistor further comprises: a gate oxide layer 241 deposited between the first field plate layer 212 and a channel layer. The first field plate layer 212 extending to a surface of part of the gate oxide layer 241 and a surface of part of the first dielectric layer 211 effectively reduces a peak intensity of surface electric field formed by the drift region 203 located below the first field plate layer 212 and is beneficial to improve the breakdown voltage.

The lateral double-diffused transistor further comprises: a second dielectric layer 214 and a second field plate layer 215 located on a surface of the second dielectric layer 214, which are located on a side of the first dielectric layer 211 away from the first field plate layer 212. That is, the second dielectric layer 214 covers a surface of part of the first field plate layer 212 and is stacked on a surface of a second portion of the first dielectric layer 211. The second field plate layer 215 locates on the surface of the second dielectric layer 214.

In an embodiment of the present disclosure, the second dielectric layer 214 is a protective oxide layer formed by an existing self-aligned silicon metallization process, which is often called a salicidation block (SAB) layer or a reaction protection oxide (RPO) layer. The salicidation block layer is used as the second dielectric layer 214 which prevents a region covered by the salicidation block layer from forming metal silicide. The salicidation block layer is directly used as the second dielectric layer 214, thus a deposition process or a photoetching process for forming a second dielectric layer is not needed. The salicidation block layer can not only be used as a protective oxide layer of a silicon region to avoid from forming metal silicide, but also can be used as a dielectric layer, which reduces manufacturing cost. The second dielectric layer 214 directly stacked on the surface of the first dielectric layer 211 increases a dielectric layer thickness near the drain region 205, improves performances on the breakdown voltage and the on-state resistance required by the transistor, and can be formed by a simple process.

In an alternative embodiment, the second field plate layer 215 comprises at least one contact channel. The first field plate layer 212 and the second field plate layer 215 are comprised in the gate structure of the transistor. The at least one contact channel is used as the second field plate layer 215, which increases a thickness of the second field plate layer 215. That is, the distance between the second field plate layer 215 and the surface of the substrate 201 is increased, thus the breakdown voltage can be improved and the on-state resistance can be reduced.

In an alternative embodiment, the second field plate layer 215 comprises a plurality of contact channels. The plurality of contact channels are respectively connected to different potentials, in order to further optimize the surface electric field, improve the breakdown voltage, and reduce the on-state resistance.

In an alternative embodiment, the plurality of contact channels can be formed by a commonly used method in current transistor manufacturing processes. The plurality of contact channels are directly used as the second field plate layer 215, which avoids some processes for forming a second field plate layer, such as deposition process and photoetching process, thus reducing production complexity.

In an alternative embodiment, the lateral double-diffused transistor further comprises: a side wall 213 located in a contact region between a side surface of the first field plate layer 212 and the second dielectric layer 214. The side wall 213 is used as an isolation layer which has isolating function.

According to the embodiment of the present disclosure, deposition and etching process can be used only for forming a single dielectric layer and a single field plate layer. By using the salicidation block layer as the second dielectric layer and using the plurality of contact channels as the second field plate layer, manufacturing steps, device area and production cost can be saved. Moreover, functions implemented by two field plate layers and two dielectric layers can stilled be ensured, leading to a high breakdown voltage and a low on-state resistance.

By using the salicidation block layer as the second dielectric layer, not only can the thickness of the dielectric layer located above the drain region be increased by stacking the salicidation block layer on the surface of the first dielectric layer, but also the silicon located below the salicidation block layer can be protected. Compared with the traditional manufacturing method which requires additional manufacturing process during forming the second dielectric layer and the second field plate layer, the second field plate layer with the at least one contact channels according to the embodiment of the present disclosure may reduce the amount of manufacturing steps.

A manufacturing method of a lateral double-diffused transistor according to a specific embodiment of the present disclosure is further described in detail in combination with FIG. 3a-FIG. 3l.

FIG. 3a-3l respectively show cross-sectional structural schematic views of a lateral double-diffused transistor in different stages of a manufacturing method of the transistor according to an embodiment of the present disclosure.

Figure 3A:
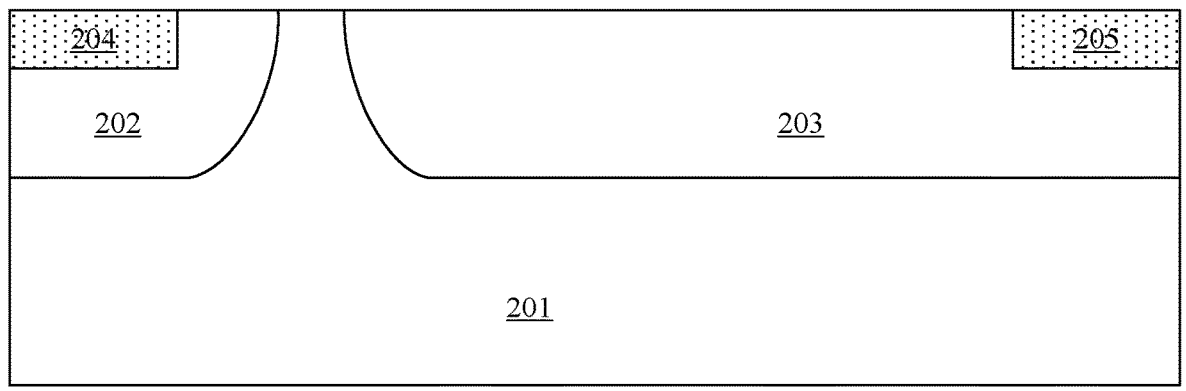
FIG. 3a-3l respectively show cross-sectional structural schematic views of a lateral double-diffused transistor in different stages of a manufacturing method of the transistor according to an embodiment of the present disclosure.

As shown in FIG. 3a, a P-type well region 202 and an N-type drift region 203 located in the top of the substrate 201 are formed, a source region 204 located in the P-type well region 202 and a drain region 205 located in the N-type drift region 203 are formed. The step of forming the P-type well region 202, the N-type drift region 203, the source region 204, and the drain region 205 can be implemented by conventional processes. N-type ions are implanted into the P-type well region 202 and the N-type drift region 203 to respectively form the source region 204 and the drain region 205.

Figure 3B:
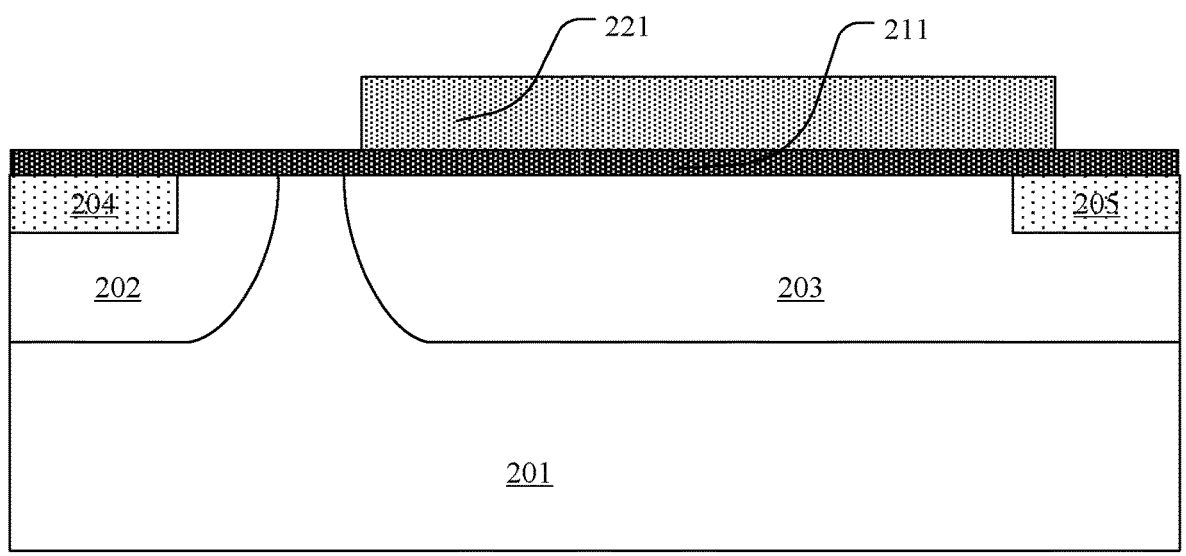

Then, as shown in FIG. 3b, a first dielectric layer 211 located on the surface of the N-type drift region 203 is formed. For example, the first dielectric layer 211 is an oxide layer, such as a silicon oxide layer. The step of forming the first dielectric layer 211 comprises: depositing an oxide layer 211 on the surface of the substrate 201, wherein the oxide layer 211 extends from the source region 204 to the drain region 205, and a surface of a portion of the oxide layer 211 located above the N-type drift region 203 is covered with a photoresist layer 221.

Figure 3C:
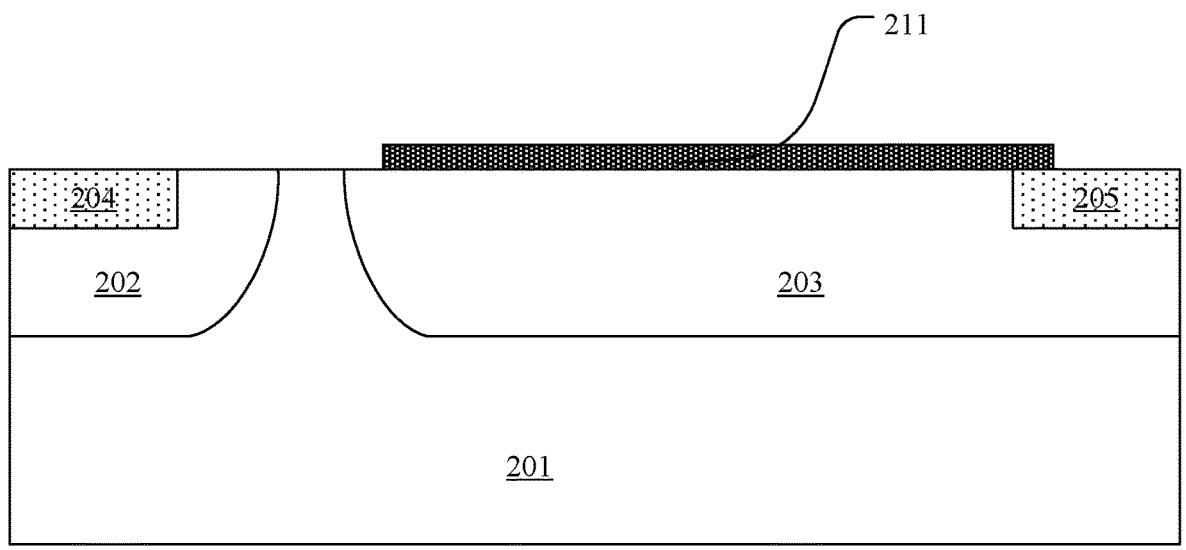

Then, as shown in FIG. 3c, a series of steps such as exposure, development and etching removal are performed to etch and remove a part of the oxide layer 211 which is uncovered by the photoresist layer 221, and finally the first dielectric layer 211 is formed. The first dielectric layer 211 covers almost on the entire surface of the drift region 203 and extends to the drain region 205.

Figure 3D:
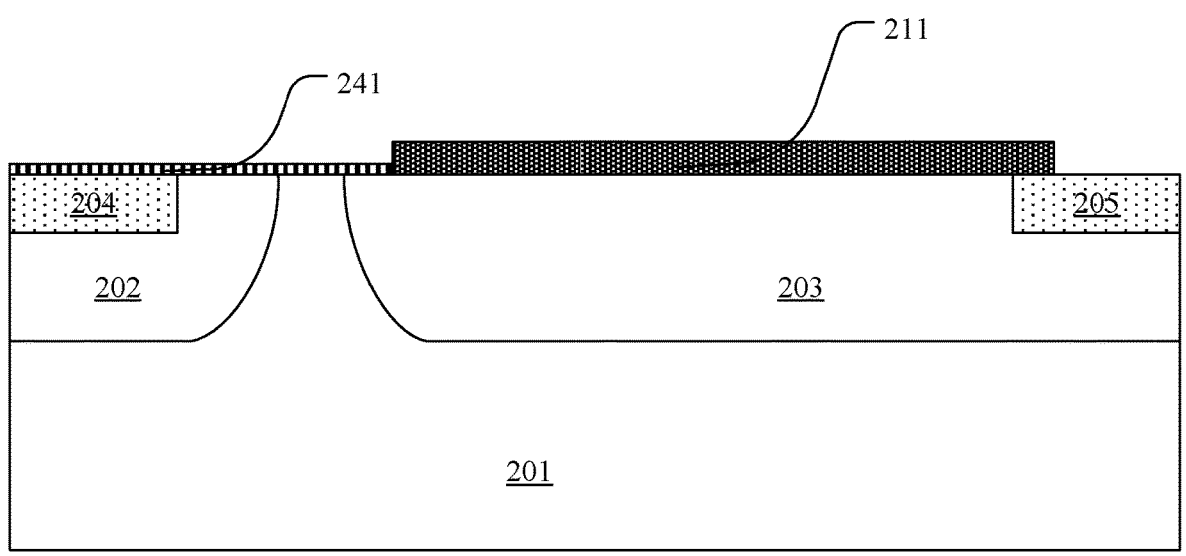

Then, as shown in FIG. 3d, a gate oxide layer 241 is grown. The gate oxide layer 241 is formed on the substrate 201 around the first dielectric layer 211 by a certain deposition process. A channel is covered by the gate oxide layer 241, that is, a surface of part of the well region 202 and a surface of part of the drift region 203 are covered by the gate oxide layer 241. The gate oxide layer 241, such as a silicon dioxide layer, acts as a gate insulator layer of the transistor. The thickness of the gate oxide layer 241, such as 2-10 nm, is related to the thickness of the first dielectric layer 211. Part of the gate oxide layer 241 located on the surface of the drain region 205 is removed in a subsequent step. The manufacturing process of the gate oxide layer 241 is a standard CMOS manufacturing process, which is not described in detail here.

Figure 3E:
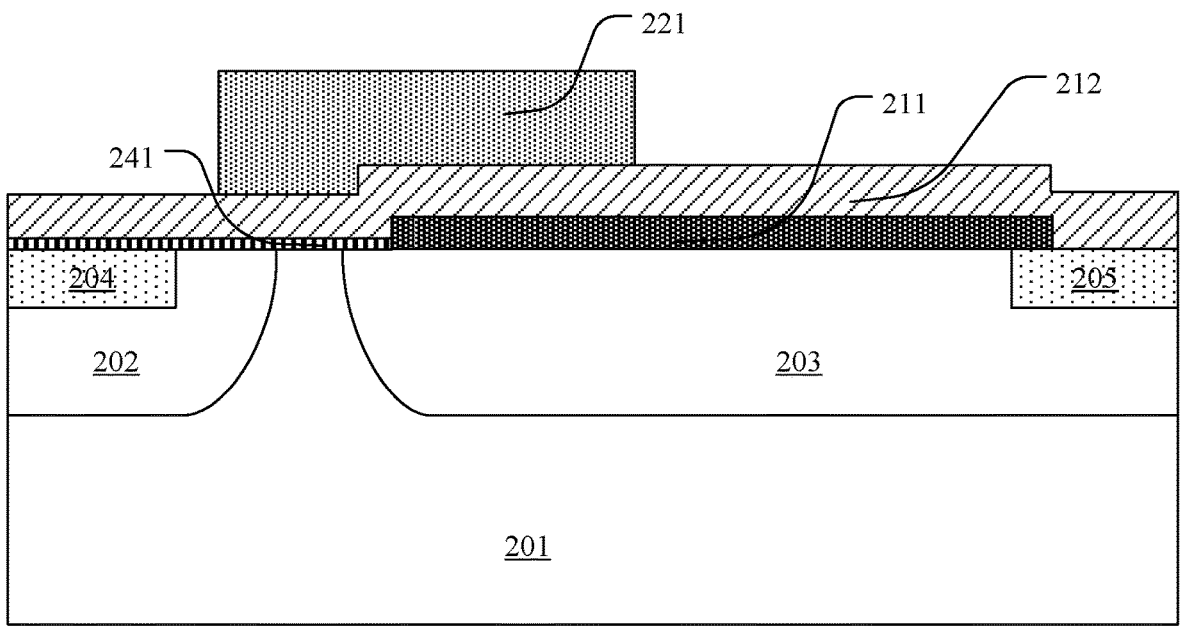

Then, as shown in FIG. 3e, a first field plate layer 212 located above the N-type drift region 203 is formed and covers a surface of a first portion of the first dielectric layer 211. The first field plate layer 212 comprised in the gate structure of the transistor is a polysilicon layer. The steps of forming the first field plate layer 212 comprises: depositing a polysilicon layer on the surface of the gate oxide layer 241 and the first dielectric layer 211 to form the first field plate layer 212 shown in FIG. 3e. The first field plate layer 212 covers on the gate oxide layer 241, the entire exposed surface of the first dielectric layer 211, and the exposed surface of the substrate 201. Then, the photoresist layer 221 is coated on the surface of the first field plate layer 212 located above the N-type drift region 203, and the photoresist layer 221 is also located above part of the P-type well region 202.

Figure 3F:
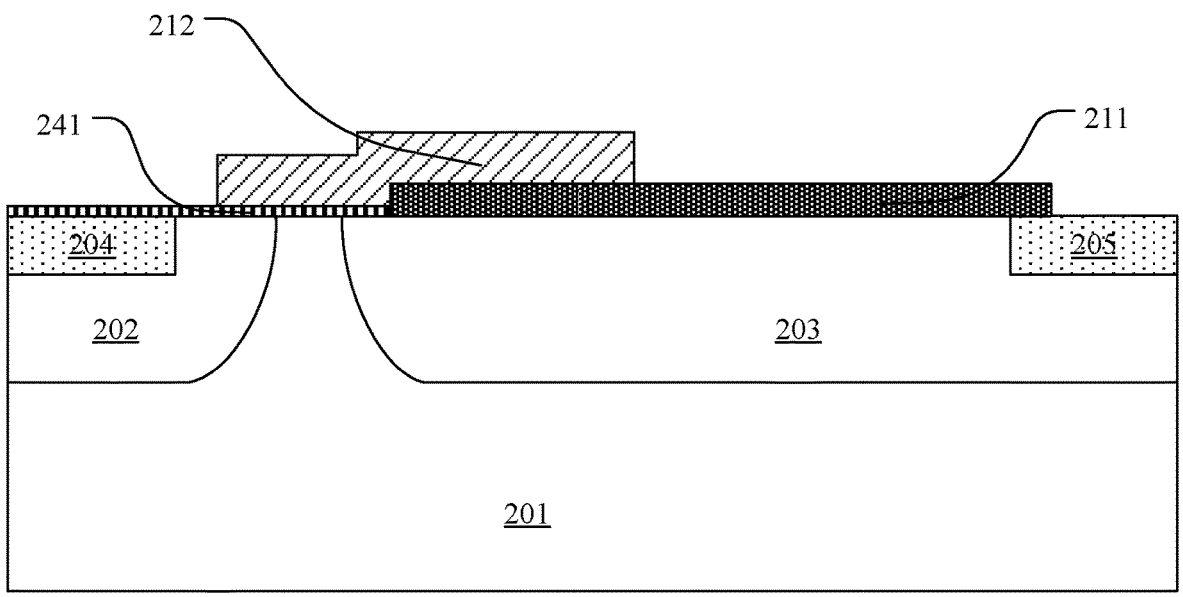

Then, as shown in FIG. 3f, when photoetching is performed, the first field plate layer 212 uncovered by the photoresist layer 221 is completely etched, leaving only part of the first field plate layer 212 covered by the photoresist layer 221. As a portion of the gate structure, the first field plate layer 212 covers part of the gate oxide layer 241 located on the P-type well region 202 and the N-type drift region 203, and covers the surface of the first portion of the first dielectric layer 211.

A single dielectric layer and a single field plate layer cannot simultaneously satisfy the requirements to increase the breakdown voltage and reduce the on-state resistance. Therefore, in the embodiment of the present disclosure, a second dielectric layer 214 and a second field plate layer 215 are fabricated.

Figure 3G:
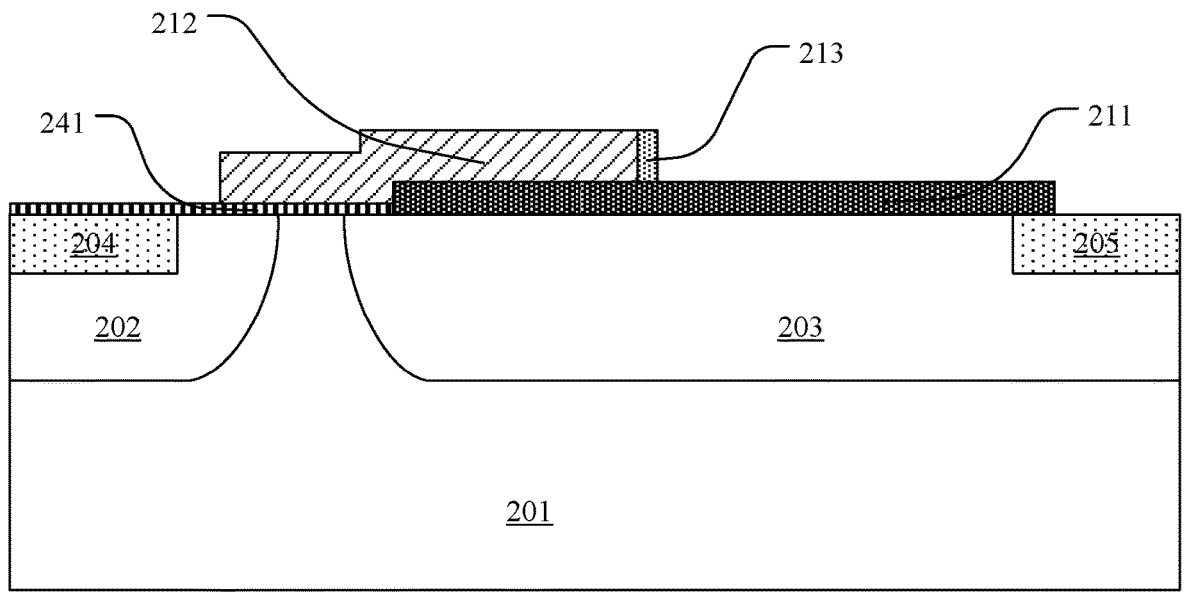

Then, as shown in FIG. 3g, a side wall 213 is formed and located at a side surface of the first field plate layer 212 in contact with the first dielectric layer 211. For example, the side wall 213 is an oxide layer or a nitride layer functioning as an isolator. The material of the side wall 213 is one of the following materials: silicon dioxide, and silicon nitride. The height of the side wall 213 is consistent with the height of the first field plate layer 212 located on the surface of the first dielectric layer 211. That is, the side wall 213 also covers the surface of a part of the first dielectric layer 211.

The side wall 213 according to the embodiment of the present disclosure can be formed by a known manufacturing process, which will not be introduced in detail here.

Figure 3H:
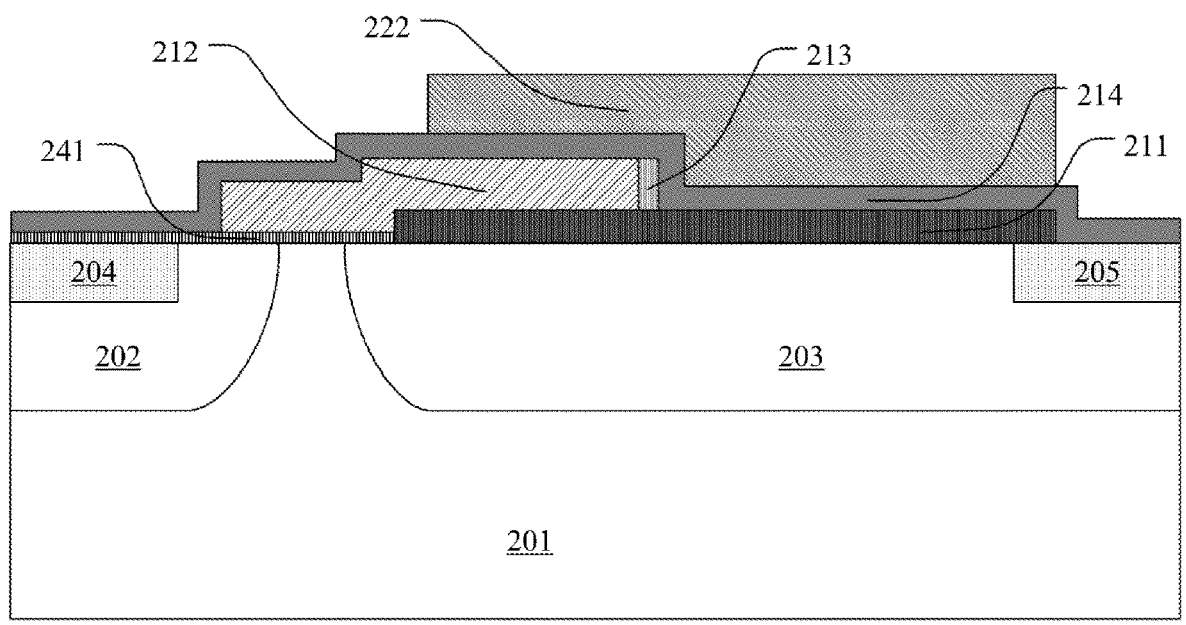
Figure 3I:
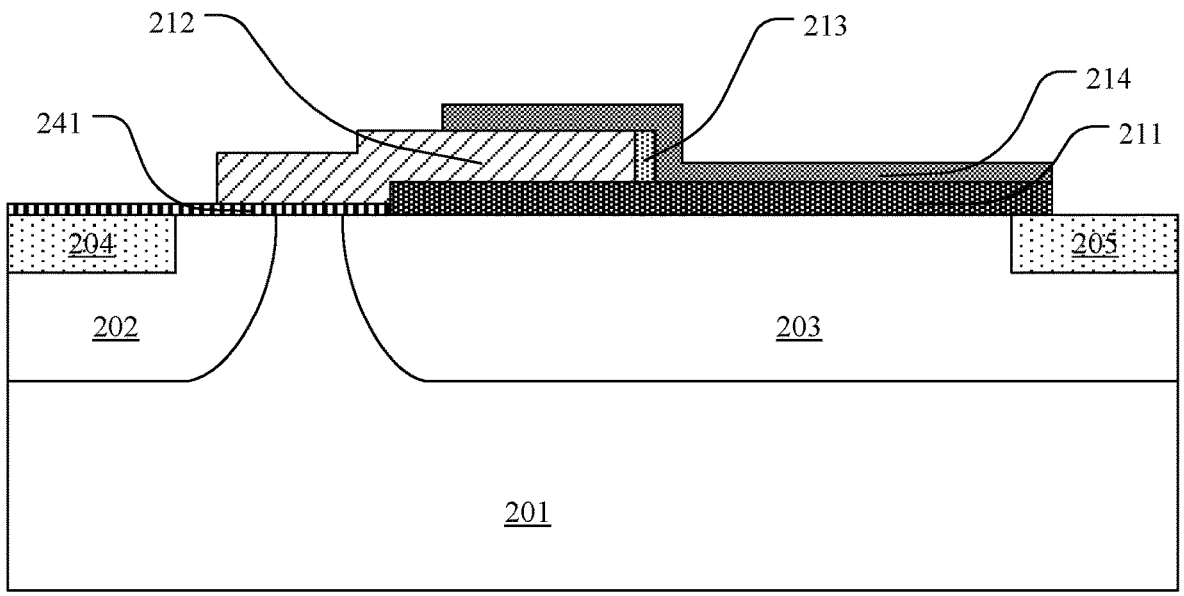

Then, as shown in FIG. 3h and FIG. 3i, a second dielectric layer 214 is formed, covers a surface of part of the first field plate layer 212 and is stacked on a surface of a second portion of the first dielectric layer 211. The step of forming the second dielectric layer 214 comprises: depositing a salicidation block layer 214 on the surface of the substrate 210, the first field plate layer 212, and the first dielectric layer 211; covering the surface of the salicidation block layer 214 located above the N-type drift region 203 with a resist mask 222; and etching and removing a portion of the salicidation block layer 214 which is uncovered by the resist mask 222. After etching, the second dielectric layer 214 is formed, as shown in FIG. 3i.

Self-aligned silicon metallization process refers to a process of depositing a layer of metal on the surface of polysilicon and reacting at a certain temperature to form compounds of metals and silicon, i.e. metal silicide. The salicidation block layer formed by the self-aligned silicon metallization process is a reaction protection oxide layer to prevent the silicon regions from reacting with metal to form metal silicide. The second dielectric layer 214 is the salicidation block (SAB) layer, so a region covered by the second dielectric layer 214 can not form metal silicide, while a region uncovered by the second dielectric layer 214, such as the drain region 205, will form metal silicide later.

The salicidation block layer is used as the second dielectric layer 214 and directly stacked on the surface of the second portion of the first dielectric layer 211 uncovered by the first field plate layer 212, and the second dielectric layer 214 covers part of the surface of the first field plate layer 212 and also covers the surface of the side wall 213, so that the dielectric layer located near the drain region 205 can be thick enough, ensuring a high breakdown voltage and a low on-state resistance.

For example, the salicidation block layer 214 used to cover a device that does not need to form self-aligned metal silicide, is manufactured by plasma enhanced chemical vapor deposition (PECVD) or sub-atmospheric pressure chemical vapor deposition (Sub-Atmosphere CVD).

Since the salicidation block layer is used as the second dielectric layer 214, there is no need to perform additional steps to deposit and etch an oxide layer to form the second dielectric layer 214. That is, only a single dielectric layer is needed to be formed by corresponding manufacturing steps according to the embodiment of the present disclosure, greatly simplifying the process flow and reducing the production cost. Moreover, since the first dielectric layer 211 is covered by the second dielectric layer 214, the thickness of the dielectric layer located near the drain region 205 is effectively increased.

In the traditional manufacturing process of the transistor with double field plate layers and double dielectric layers, it is necessary to form two dielectric layers, two field plate layers, and a salicidation block layer to protect the silicon regions from reacting. However, in the manufacturing process of the transistor with double field plate layers and double dielectric layers according to the embodiments of the present disclosure, the salicidation block layer is used as the second dielectric layer, which simplifies the manufacturing process of the transistor, reduces the volume and thickness of the transistor, and improves the performance of the transistor.

Figure 3J:
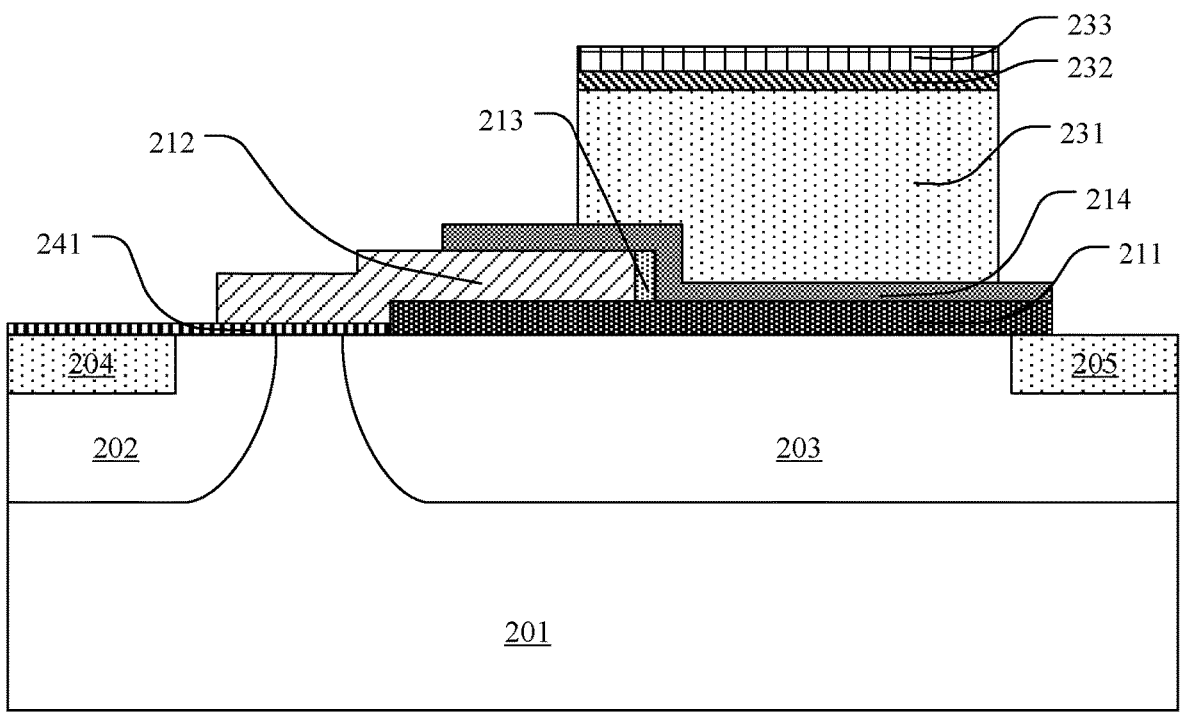
Figure 3K:
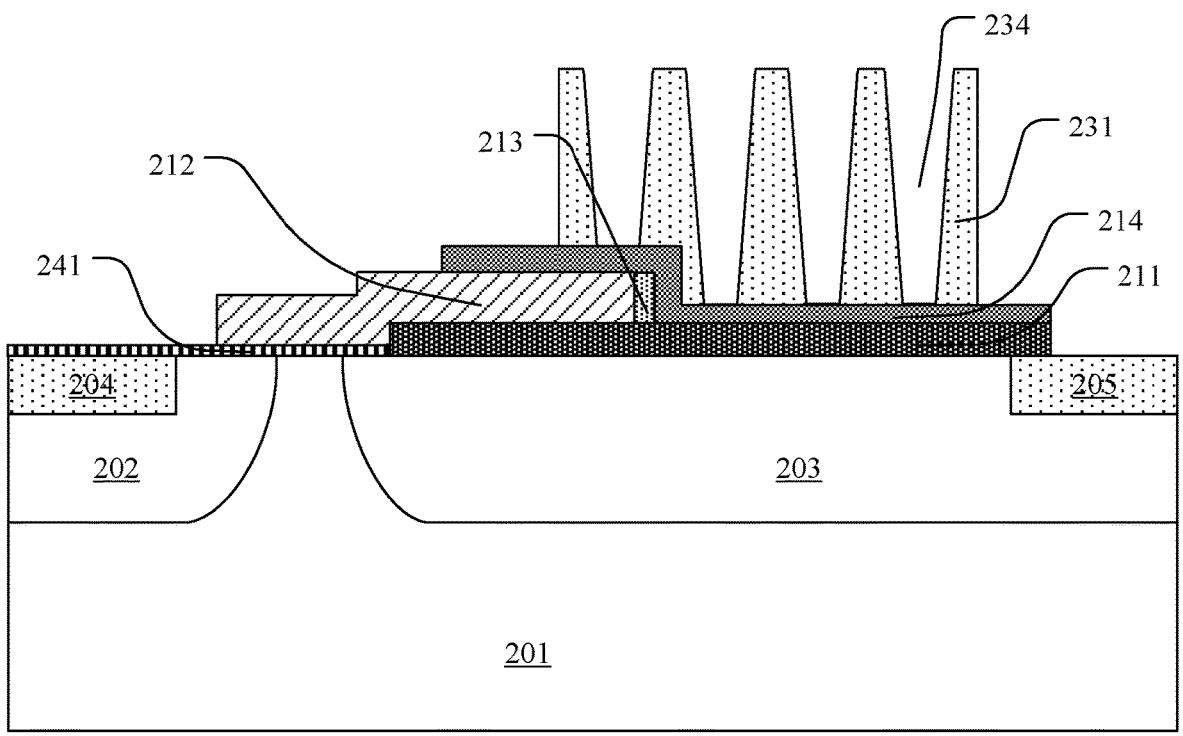
Figure 3L:
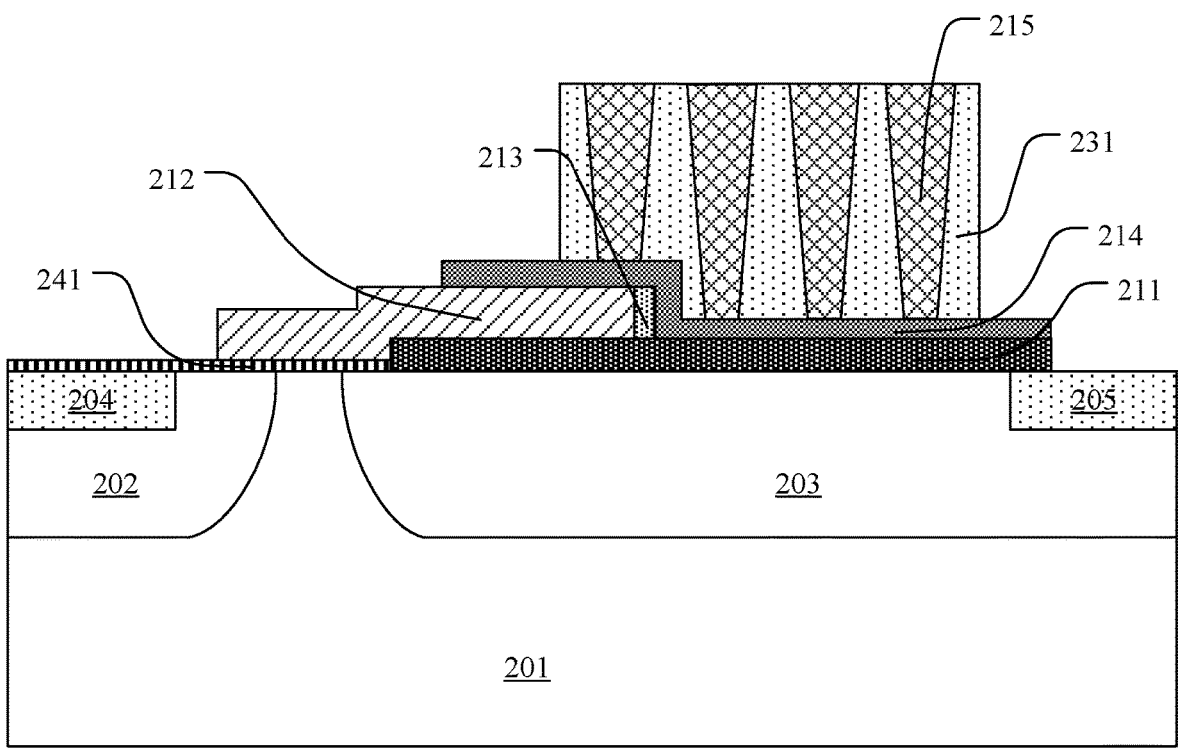

Then, as shown in FIG. 3j and FIG. 3l, a second field plate layer 215 is formed and located on the surface of the second dielectric layer 214, wherein the second field plate layer 215 comprises at least one contact channel. The second field plate layer 215 is formed by deposition and etching process.

Specifically, the step of forming the second field plate layer 215 comprises: successively depositing an oxide layer 231, an etching barrier layer 232 and an interlayer dielectric layer 233 on the surface of the second dielectric layer 214, as shown in FIG. 3j; etching the interlayer dielectric layer 233, the etching barrier layer 232 and the oxide layer 231 to form at least one through hole 234, the at least one through hole 234 each serves as a corresponding one of at least one contact hole, as shown in FIG. 3k; depositing metal in the at least one through hole 234 to form at least one metal plug and performing planarization, as shown in FIG. 3l, thus the second field plate layer 215 can be formed. The material of the at least one metal plug comprises one of the following materials: tungsten, and titanium.

Each contact channel included in the at least one contact channel can be a cylinder extending along the direction perpendicular to the surface of the second dielectric layer 214, and is located in a corresponding one of the at least one contact hole 234. Due to the technical reasons, a width of a first end of each contact channel can be larger than a second end of that contact channel, wherein the first end is away from the second dielectric layer 214 and the second end is close to the second dielectric layer 214. That is, each contact channel may has a taper-type shape with a decreasing width from top to bottom.

In a possible implementation embodiment, as shown in FIG. 3*l*, the second field plate layer 215 comprises a plurality of contact channels arranged in a row along an extension direction from the source region 204 to the drain region 205. And the height of one of the plurality of contact channels on the surface of the second dielectric layer 214 located above the first field plate layer 212 is less than the height of one of the plurality of contact channels located above the second portion of the first dielectric layer 211. In other words, a row of contact channels are arranged in the direction extending from the source region 204 to the drain region 205, and since part of the first field plate layer 212 is covered by the second dielectric layer 214, the height of each contact channel located above the first field plate layer 212 is less than that located above the second portion of the first dielectric layer 211. In a possible implementation embodiment, the plurality of contact channels are arranged at equal intervals.

The plurality of contact channels in the second field plate layer 215 can be connected to a same potential which may be a potential of the drain electrode or the source electrode of the transistor. The plurality of contact channels can also be respectively connected to different potentials, each selected from potentials such as the potentials on the source electrode, the drain electrode, the gate electrode of the transistor, and any other intermediate potentials generated by a corresponding circuit comprising the transistor. Different potentials can be connected according to actual needs. Each of the plurality of contact channels can be connected to different potential to further optimize the surface electric field, so that the breakdown voltage can be further increased and the on-state resistance can be further reduced.

Figure 4:
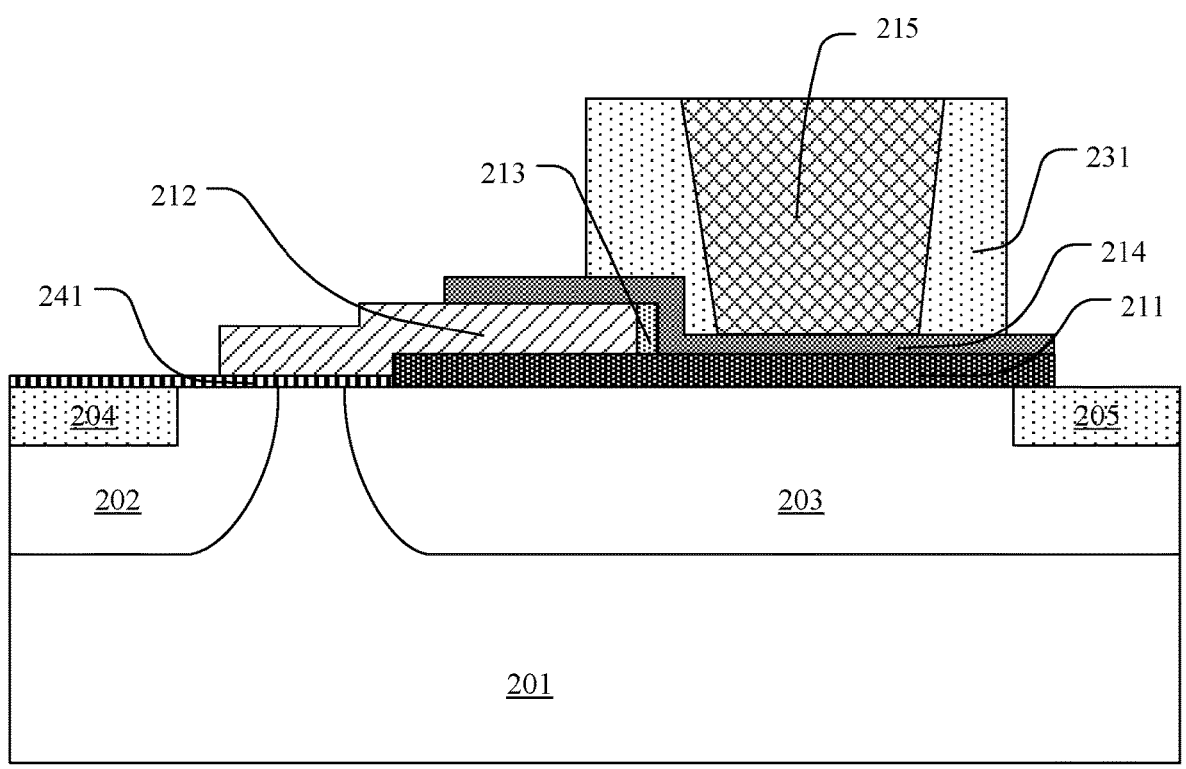
FIG. 4 shows a cross-sectional structural schematic view of a lateral double-diffused transistor according to an embodiment of the present disclosure.

FIG. 4 shows a cross-sectional structural schematic view of a lateral double-diffused transistor according to an embodiment of the present disclosure.

In the embodiment of the present disclosure, as shown in FIG. 4, the second field plate layer 215 comprises a contact channel with a wide width. For example, the contact channel is on the surface of the second dielectric layer 214 located above the first dielectric layer 211. Compared with the embodiment shown in FIG. 3*l*, wherein the width of the plurality of contact channels are relatively uniform, the embodiment shown in FIG. 4 only has a single contact channel, thus the width of the contact channel is preferred to be larger than that of any one of the plurality of contact channels shown in FIG. 3*k*.

In the embodiment of the present disclosure, the contact channel is directly used as the second field plate layer, so there is no need to perform additional steps to deposit and etch an oxide layer to form the second dielectric layer, which greatly simplifies the process flow. In addition, because the height of the contact channel is large enough, a long distance between the second field plate layer and the substrate can be achieved, which improves the breakdown voltage and reduces the on-state resistance. The thickness of the first field plate layer 212 can be around 2000 angstroms (Å), the thickness of the second field plate layer 205 can be around 8000 angstroms, the thickness of the first dielectric layer 211 can be around 300-800 angstroms, and the thickness of the second dielectric layer 214 can be around 500-1000 angstroms.

To sum up, according to the embodiments of the present disclosure, the manufacturing process of the second dielectric layer and the second field plate layer of the lateral double-diffused transistor is optimized, compared with the traditional lateral double-diffused transistor structure. The salicidation block layer commonly used in the transistor manufacturing process is used as the second dielectric layer of the transistor, thus not only can the silicon located below the second dielectric layer be protected by the salicidation block layer, but also the salicidation block layer can serve as a dielectric layer, so that there is no need to etch the oxide layer again to form a second dielectric layer, simplifying the manufacturing process. Meanwhile, the salicidation block layer is stacked on the surface of the first dielectric layer, which increases the thickness of the dielectric layer located above the drain region, thus effectively increasing the breakdown voltage of the transistor and reducing the on-state resistance. Moreover, the at least one contact channel is used as the second field plate layer, so that there's no need to etch metal or polysilicon to form a second field plate layer, saving resources and the volume occupied by the transistor. Meanwhile, the distance between the second field plate layer and the substrate can be large enough, achieving the improvement on the breakdown voltage and the reduction of the on-state resistance.

According to the embodiments of the present disclosure described above, these embodiments neither describe all the details in detail, nor limit the present disclosure to only the specific embodiments described. Obviously, according to the above description, many modifications and changes can be made. In order to better explain the principle and practical application of the present invention, the present specification selects and specifically describes these embodiments, so that the person skilled in the technical field can make good use of the present invention and the modification based on the present invention. The present invention is only limited by the claims, full scope and equivalents of the claims.

What is claimed is:

1. A lateral double-diffused transistor, wherein the transistor comprises:
   a substrate;
   a well region and a drift region both located in top of the substrate, a source region located in the well region, and a drain region located in the drift region;
   a first dielectric layer located on a surface of the drift region;
   a first field plate layer located above the drift region and covering a first portion of the first dielectric layer;
   a second dielectric layer covering a surface of part of the first field plate layer and stacked on a surface of a second portion of the first dielectric layer;
   a second field plate layer located on a surface of the second dielectric layer, wherein the second field plate layer comprising at least one contact channel,
   wherein an oxide layer is directly located on an upper surface of the second dielectric layer, each of the at least one contact channel extends from an upper surface of the oxide layer to an upper surface of a portion of the second dielectric layer, wherein the portion of the second dielectric layer has a lower surface in direct contact with the second portion of the first dielectric layer or in direct contact with the surface of part of the first field plate layer, wherein each contact channel included in the at least one contact channel is a metal plug filled in a corresponding one of at least one through hole which is formed in the second field plate layer and extends perpendicularly to the surface of the second dielectric layer.

2. The lateral double-diffused transistor according to claim 1, wherein the second dielectric layer is a salicidation block layer which prevents metal silicide from forming in a region covered by the salicidation block layer.

3. The lateral double-diffused transistor according to claim 2, wherein the salicidation block layer is an oxide layer.

4. The lateral double-diffused transistor according to claim 1, wherein the second field plate layer comprises a plurality of contact channels, each of which is included in said at least one contact channel, arranged in a row along an extension direction from the source region to the drain region.

5. The lateral double-diffused transistor according to claim 4, wherein one of the plurality of contact channels which is located above the first field plate layer has a height less than a height of another one of the plurality of contact channels which is located above the second portion of the first dielectric layer.

6. The lateral double-diffused transistor according to claim 4, wherein the plurality of contact channels are respectively connected to different potentials.

7. The lateral double-diffused transistor according to claim 1, wherein the transistor further comprises:
a side wall which is located in a contact region between a side surface of the first field plate layer and the second dielectric layer, and used as an isolation layer.

8. The lateral double-diffused transistor according to claim 1, wherein the first dielectric layer extends along a direction from the source region to the drain region and covers a part of the drain region.

9. A manufacturing method of a lateral double-diffused transistor, comprising:
forming a well region and a drift region in top of substrate;
forming a source region located in the well region, and a drain region located in the drift region;
forming a first dielectric layer located on a surface of the drift region;
forming a first field plate layer located above the drift region and covering a surface of a first portion of the first dielectric layer;
forming a second dielectric layer covering a surface of a part of the first field plate layer and stacked on a surface of a second portion of the first dielectric layer;
forming a second field plate layer located on a surface of the second dielectric layer, wherein the second field plate layer comprising at least one contact channel,
wherein an oxide layer is directly located on an upper surface of the second dielectric layer, each of the at least one contact channel extends from an upper surface of the oxide layer to an upper surface of a portion of the second dielectric layer, wherein the portion of the second dielectric layer has a lower surface in direct contact with the second portion of the first dielectric layer or in direct contact with the surface of part of the first field plate layer,
wherein each contact channel included in the at least one contact channel is a metal plug filled in a corresponding one of at least one through hole which is formed in the second field plate layer and extends perpendicularly to the surface of the second dielectric layer.

10. The manufacturing method according to claim 9, wherein the second dielectric layer is a salicidation block layer which prevents metal silicide from forming in a region covered by the salicidation block layer.

11. The manufacturing method according to claim 10, wherein the salicidation block layer is an oxide layer.

12. The manufacturing method according to claim 9, wherein the second field plate layer comprises a plurality of contact channels, each of which is included in said at least one contact channel, arranged in a row along an extension direction from the source region to the drain region.

13. The manufacturing method according to claim 12, wherein one of the plurality of contact channels which is located above the first field plate layer has a height less than another one of the plurality of contact channels which is located above the second portion of the first dielectric layer.

14. The manufacturing method according to claim 12, wherein the plurality of contact channels are respectively connected to different potentials.

15. The manufacturing method according to claim 9, further comprising:
forming a side wall located in a contact region between a side surface of the first field plate layer and the second dielectric layer.

16. The manufacturing method according to claim 9, wherein step of forming the second dielectric layer comprises:
depositing the salicidation block layer on the surface of the substrate, the first field plate layer, and the first dielectric layer;
covering a surface of the salicidation block layer located above the drift region with a resist mask; and
etching and removing a portion of the salicidation block layer which is uncovered by the resist mask.

17. The manufacturing method according to claim 11, wherein step of forming the second field plate layer comprises:
successively depositing an oxide layer, an etching barrier layer and an interlayer dielectric layer on the surface of the second dielectric layer;
etching the interlayer dielectric layer, the etching barrier layer and the oxide layer to form the at least one through hole;
depositing metal in each one of the at least one through hole to form the corresponding metal plug; and
performing planarization.

18. The manufacturing method according to claim 9, wherein material of the first field plate layer comprises polysilicon, and material of the first dielectric layer comprises oxide.

19. The manufacturing method according to claim 9, wherein a thickness of the first dielectric layer is 300-800 angstroms, and a thickness of the second dielectric layer is 500-1000 angstroms.

* * * * *